United States Patent
Liang et al.

(10) Patent No.: US 10,910,459 B2
(45) Date of Patent: Feb. 2, 2021

(54) DISPLAY PANEL AND DISPLAY DEVICE

(71) Applicant: WUHAN TIANMA MICRO-ELECTRONICS CO., LTD., Wuhan (CN)

(72) Inventors: Yujiao Liang, Wuhan (CN); Mengmeng Zhang, Wuhan (CN); Di Zhu, Wuhan (CN); Tao Peng, Wuhan (CN); Yue Li, Wuhan (CN); Yana Gao, Wuhan (CN); Xingyao Zhou, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 64 days.

(21) Appl. No.: 16/255,821

(22) Filed: Jan. 24, 2019

(65) Prior Publication Data

US 2019/0157375 A1 May 23, 2019

(30) Foreign Application Priority Data

Sep. 21, 2018 (CN) .......................... 2018 1 1110237

(51) Int. Cl.
*H01L 27/32* (2006.01)
*H01L 51/52* (2006.01)
(Continued)

(52) U.S. Cl.
CPC ....... *H01L 27/3276* (2013.01); *G09G 3/3225* (2013.01); *H01L 27/3225* (2013.01); *H01L 51/5246* (2013.01); *G09G 3/3266* (2013.01)

(58) Field of Classification Search
CPC .............. H01L 27/3276–3279; H01L 51/5246
See application file for complete search history.

(56) References Cited

U.S. PATENT DOCUMENTS

2013/0044046 A1* 2/2013 Huang .................. H01L 51/524
345/76
2017/0294502 A1* 10/2017 Ka ....................... H01L 27/3262
(Continued)

FOREIGN PATENT DOCUMENTS

| CN | 107579078 A | | 1/2018 |
|----|-------------|---|--------|
| CN | 108182886 | * | 6/2018 |
| CN | 108182886 A | | 6/2018 |

OTHER PUBLICATIONS

Office Action of Chinese Patent Application No. 201811110237X dated Mar. 27, 2020.

*Primary Examiner* — Daniel Luke
(74) *Attorney, Agent, or Firm* — Kilpatrick Townsend & Stockton, LLP

(57) ABSTRACT

A display panel is provided having a transparent region, a display area surrounding the transparent region, and a non-display area surrounding the display area, and the display panel includes: at least one binding pin; at least one signal line only located within the display area and not located within the transparent region; at least one connection line located within the non-display region; and glass cement located within the non-display region. The signal lines include a first signal line and a second signal line, and the first signal line and the at least one binding pin are respectively located at two sides of the transparent region; the first signal line is electrically connected to the at least one connection line; and at least a part of the at least one connection line overlaps with the glass cement. The display panel is used for image display.

15 Claims, 7 Drawing Sheets

(51) Int. Cl.
*G09G 3/3225* (2016.01)
*G09G 3/3266* (2016.01)

(56) References Cited

U.S. PATENT DOCUMENTS

2019/0214595 A1* 7/2019 Park .................. G06F 3/0443
2020/0027843 A1* 1/2020 Liang ................. H01L 23/544

* cited by examiner

DISPLAY PANEL AND DISPLAY DEVICE

CROSS-REFERENCE TO RELATED APPLICATIONS

The present application claims priority to Chinese Patent Application No. 201811110237.X, filed on Sep. 21, 2018, the content of which is incorporated herein by reference in its entirety.

FIELD

The present disclosure relates to the field of display technologies, and in particular, to a display panel and a display device.

BACKGROUND

With the development of display technologies, devices such as cameras and photoelectric sensors are usually provided in the display panel to meet the user's various usage requirements. At present, in order to increase a screen-to-body ratio of the display panel, devices such as cameras, photoelectric sensors, and the like are usually disposed within a display region of the display panel. Usually, the display panel has a transparent region, in which devices such as cameras or photoelectric sensors are disposed. In this way, signal lines including a data line and the like in the display panel need to be disposed around the transparent region, resulting in dense lines around the transparent region, and thus increasing a width of a non-display region surrounding the transparent region.

SUMMARY

In view of this, embodiments of the present disclosure provide a display panel and a display device for reducing a frame width at a transparent region of the display panel.

In one embodiment, the present disclosure provides a display panel. The display panel has a transparent region, a display region surrounding the transparent region, and a non-display region surrounding the display region. The display panel comprises: at least one binding pin; at least one signal line disposed within the display region; at least one connection line disposed within the non-display region; and glass cement disposed within the non-display region. No signal line is disposed within the transparent region. The at least one signal line comprises a first signal line and a second signal line, and the first signal line and the at least one binding pin are respectively located at two sides of the transparent region. The first signal line is electrically connected to the at least one connection lin. At least a part of the at least one connection line overlaps with the glass cement.

In another embodiment, the present disclosure provides a display device, and the display device includes any of the display panels provided in the present disclosure.

BRIEF DESCRIPTION OF DRAWINGS

Embodiments of the present disclosure, the accompanying drawings used in the embodiments are briefly introduced as follows.

DESCRIPTION OF EMBODIMENTS

Embodiments of the present disclosure will be described in detail as follows with reference to the accompanying drawings.

It should be noted that, the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although the signal line may be described using the terms of "first", "second", etc., in the embodiments of the present disclosure, the signal lines will not be limited to these terms. These terms are merely used to distinguish signal lines from one another. For example, without departing from the scope of the embodiments of the present disclosure, a first signal line may also be referred to as a second signal line, similarly, a second signal line may also be referred to as a first signal line.

Figure 1:
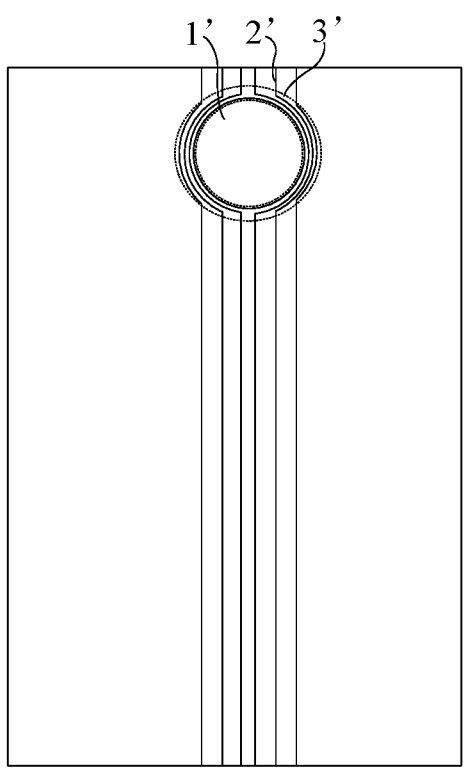
FIG. 1 is a schematic diagram of a display panel in the related art.

FIG. 1 is a schematic diagram of a display panel in the related art. As shown in FIG. 1, the display panel has a transparent region 1', in which a device such as a camera or a photoelectric sensor is disposed. In this way, signal lines including a data line 2' and the like in the display panel need to be disposed around the transparent region 1', resulting in dense lines around the transparent region 1', and thus increasing a width of a non-display region 3' surrounding the transparent region 1'.

Figure 2:
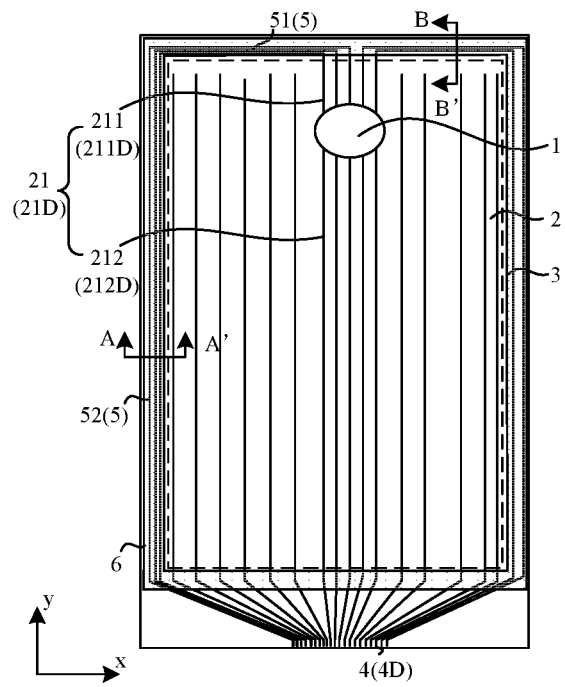
FIG. 2 is a schematic diagram of a display panel according to an embodiment of the present disclosure.

An embodiment of the present disclosure provides a display panel. FIG. 2 is a schematic diagram of a display panel according to an embodiment of the present disclosure. As shown in FIG. 2, the display panel is divided into a transparent region 1, a display region surrounding the transparent region 1, and a non-display region 3 surrounding display region 2.

As shown in FIG. 2, the display panel includes at least one binding pin 4, at least one signal line 21, at least one connection line 5, and glass cement 6. The at least one signal line 21 is merely disposed within the display region 2, and no signal line 21 is disposed within the transparent region 1. The at least one signal line 21 includes at least one first signal line 211 and at least one second signal line 212. The first signal line 211 and the binding pin 4 are located at two sides of the transparent region 1. That is, the binding pin 4, the transparent region 1, and the first signal line 211 are sequentially arranged in a second direction y. In other words, the transparent region 1 is located between the binding pin 4 and the first signal line 211 in the second direction y. It means that the transparent region 1 prevents the first signal line 211 from reversely extending in the second direction y to be directly connected to the binding pin 4. Therefore, it is necessary to provide a connection line 5 within the non-display region 3 to electrically connect the first signal line 211 to the binding pin 4.

Figure 3:
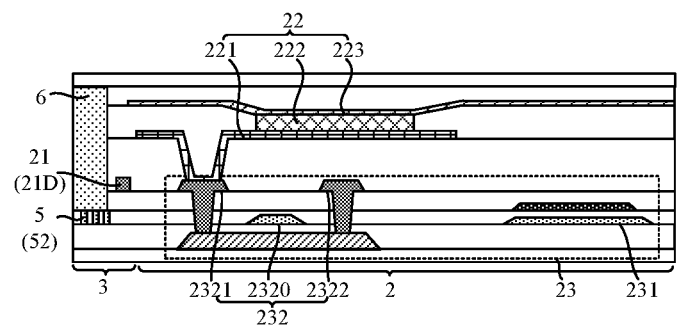
FIG. 3 is a cross-sectional view of FIG. 2 along AA' line.

The connection line 5 is disposed within the non-display region 3, and the first signal line 211 is electrically connected to the connection line 5. FIG. 3 is a schematic cross-sectional view along line AA' of FIG. 2. As shown in FIG. 2 and FIG. 3, the glass cement 6 is disposed within the non-display region 3, and at least a part of the connection line 5 overlaps with the glass cement 6.

In the embodiments of the present disclosure, the display panel is divided into a transparent region 1 and a display region 2 surrounding the transparent region, the display region 2 is provided with at least one signal line 21 and the transparent region 1 is provided with no signal line 21. In this way, it can avoid an influence of the signal line 21 on light transmittance of the transparent region 1, such that light-sensing devices such as a camera, a light sensor, and an iris sensor can be disposed within the transparent region 1 to enrich the usage functions of the display panel.

Moreover, in this embodiment of the present disclosure, the at least one signal line 21 disposed within the display region 2 includes at least one first signal line 211 and at least one second signal line 212, and at least one connection line 5 connected to the first signal line 211 is disposed within the non-display region 3, so that the signal line 21 can keep away from the transparent region 1. In this way, under a precondition of increasing light transmittance of the transparent region 1, it can avoid that too many lines are disposed around the transparent region 1, so that more space in the display panel can be used for arranging pixels, thereby improving the screen-to-body ratio of the display panel.

In addition, in this embodiment of the present disclosure, within the non-display region 3, at least a part of the connection line 5 overlaps with the glass cement 6, such that the laser reaching the glass cement 6 can be reflected to the glass cement 6 by the connection line 5, when the glass cement 6 is melted to achieves encapsulation of the display panel, which can increase a usage rate of the laser and expedite melting of the glass cement 6. Moreover, in this embodiment, at least a part of the connection line 5 overlaps with the glass cement 6, so that space occupied by the connection line 5 and the glass cement 6 can be reduced, so that the non-display region 3 can be set smaller, thereby further improving the screen-to-body ratio of the display panel.

In an example, as shown in FIG. 3, the display region 2 is further provided with a light-emitting device 22 and a pixel driving circuit 23. The pixel driving circuit 23 includes a storage capacitor 231 and a plurality of thin film transistors 232 (only the thin film transistor 232 directly connected to the light-emitting device 22 is illustrated in the figure), and the thin film transistor 232 includes a source 2321, a drain 2322, and a gate 2320. The organic light-emitting device 22 includes an anode 221, a light-emitting layer 222, and a cathode 223 that are stacked. The anode 221 is electrically connected to the source 2321 or the drain 2322 of the thin film transistor 232.

In an example, with further reference to FIG. 2, the abovementioned at least one signal line 21 includes N data lines 21D arranged in a first direction x and extending in the second direction y. Here, N is a positive integer. The at least one data line 21D includes a first data line 211D and a second data line 212D. The abovementioned at least one binding pin 4 includes a data line binding pin 4D. The first data line 211D and the data line binding pin 4D are located at two sides of the transparent region 1. As shown in FIG. 2, the data line binding pin 4D, the transparent region 1, and the first data line 211D are sequentially arranged in the second direction y. That is, the transparent region 1 is located between the data line binding pin 4 and the first data line 211D in the second direction y. In this embodiment of the present disclosure, the connection line 5 electrically connecting the first data line 211D to the data line binding pin 4D is disposed within the non-display region 3, so that the first data line 211D can be electrically connected to the data line binding pin 4D in a case where the display panel has a transparent region 1 provided with no data line. In this way, under a precondition of increasing light transmittance of the transparent region 1, it achieves that the data line is electrically connected to the data line binding pin 4D, so that normal usage function of the data line can be achieved.

As shown in FIG. 2, the second data line 212D is electrically connected to the data line binding pin 4D. Here, the data line binding pin 4D can be connected to a driving chip (not shown) disposed within the non-display region 3, and the driving chip provides a data signal to the second data line 212D disposed within the display region 2 through the data line binding pin 4D, thereby driving a pixel connected to the second data line 212D to perform displaying.

In an embodiment, with further reference to FIG. 2, the abovementioned at least one connection line 5 includes a first connection line 51 and a second connection line 52. A first end of the first data line 211D is connected to a first end of the first connection line 51, and a second end of the first connection line 51 is connected to a first end of the second connection line 52. The second connection line 52 is disposed within the non-display region 3, and the second connection line 52 overlaps with the glass cement 6. In an embodiment, as shown in FIG. 2, the first connection line 51 extends in the first direction x and the second connection line 52 extends in the second direction y. In this embodiment, the at least one connection line 5 includes the first connection line 51 and the second connection line 52, and the first data line 211D is connected to the first connection line 51 and the second connection line 52, so that the data line 21D can keep away from the transparent region 1, thereby increasing light transmittance of the transparent region 1. Moreover, in this embodiment, the second connection line 52 overlaps with the glass cement 6, so that the size of a part of the non-display region 3 in which the second connection line 52 is disposed can be reduced.

In an example, as shown in FIG. 2, a second end of the second connection line 52 is electrically connected to the data line binding pin 4D. In this way, the driving chip can provide data signals to the first data line 211D disposed within the display region 2 sequentially through the data line binding pin 4D, the second connection line 52, and the first connection line 51, thereby driving a pixel connected to the first data line 211D to perform displaying.

It should be noted that the data line binding pin 4D connected to the second data line 212D may be or may be not the data line binding pin 4D connected to the second connection line 52, which is not limited herein by the embodiments of the present disclosure.

In an implementation, the first connection line 51 may be disposed within the display region 2 or within the non-display region 3, and details will be individually described in the following.

Figure 4:
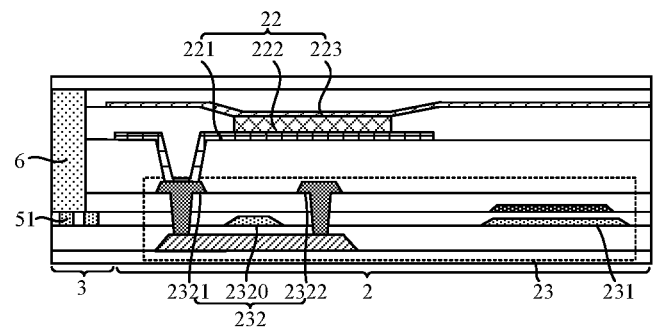
FIG. 4 is a cross-sectional view of FIG. 2 along BB' line.

FIG. 4 is a schematic cross-sectional view along line BB' of FIG. 2. As shown in FIG. 2 and FIG. 4, the first connection line 51 is disposed within the non-display region 3. In this embodiment, the first connection line 51 overlaps with the glass cement 6, so that the size of a part of the non-display region 3 in which the first connection line 51 is disposed can be further reduced on the basis of reducing the size of a part of the non-display region 3 in which the second connection line 52 is disposed. Moreover, the first connection line 51 can be disposed in a same layer as the gate 2320 of the thin film transistor 232, so that the first connection line 51 and the gate 2320 can be formed by one process, thereby simplifying the manufacturing process.

Figure 5:
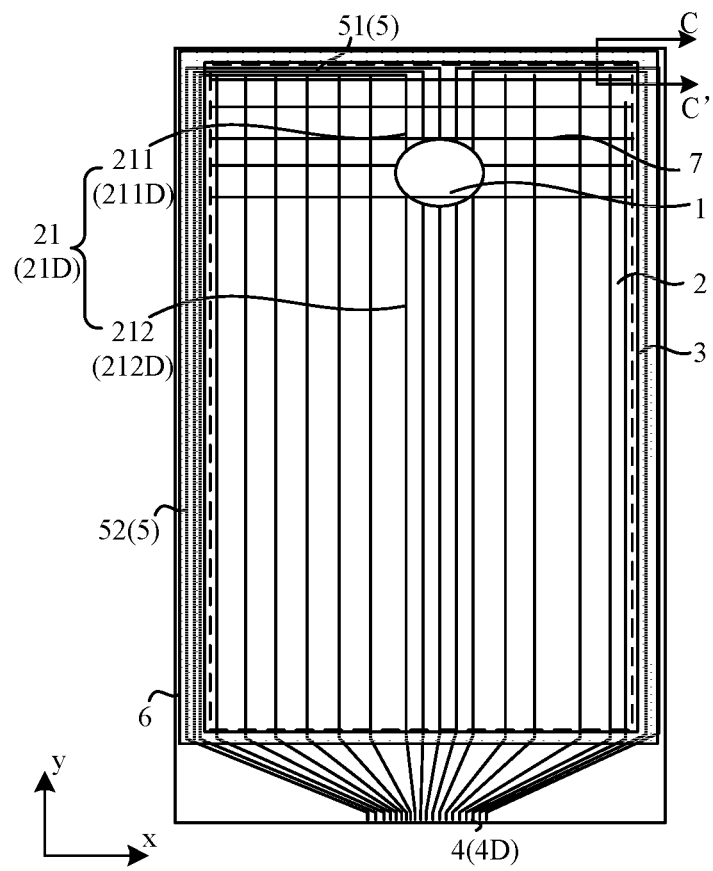
FIG. 5 is a schematic diagram of another display panel according to an embodiment of the present disclosure.
Figure 6:
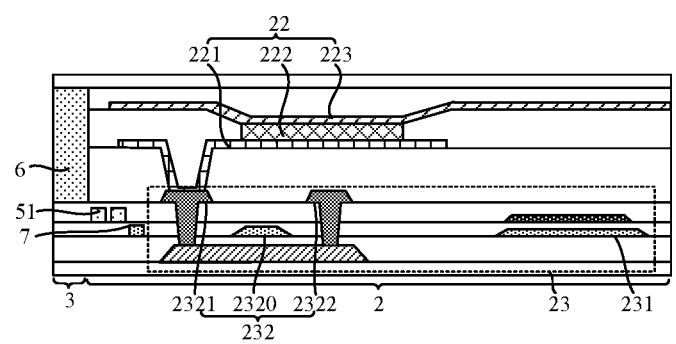
FIG. 6 is a cross-sectional view of FIG. 5 along CC' line.

In another embodiment, as shown in FIG. 5, which is a schematic diagram of another display panel according to an embodiment of the present disclosure, the first connection line 51 is disposed within the display region 2. As shown in FIG. 5, the display panel further includes scan lines 7, which are merely disposed within the display region 2 and not provided within the transparent region 1, so as to increase light transmittance of the transparent region 1. The scan lines 7 extend in the first direction x and the scan lines are arranged in the second direction y. FIG. 6 is a schematic cross-sectional view along line CC' of FIG. 5. As shown in FIG. 6, in this embodiment, the first connection line 51 and the scan line 7 are disposed in different layers when the first connection line 51 is disposed with the display region 2. In this way, on the basis of increasing space utilization of the display region 2, it can prevent the first connection line 51 from affecting the accuracy of the signal in the scan line 7.

It should be noted that the display region 2 is further provided with a reference voltage signal line Vref and various signal lines such as a power signal line PVDD (for the sake of simplicity of the illustration, the reference voltage signal line Vref and the power signal line PVDD are not shown in FIGS. 5 and 6). In this embodiment, when the first connection line 51 is disposed within the display region 2, it merely requires that the first connection line 51 is not connected to other signal line in the display region 2 other than the first data line 211D and is disposed in a different layer from the scan line 7, and other limitation on the position of the first connection line 51 is not made herein.

Figure 7:
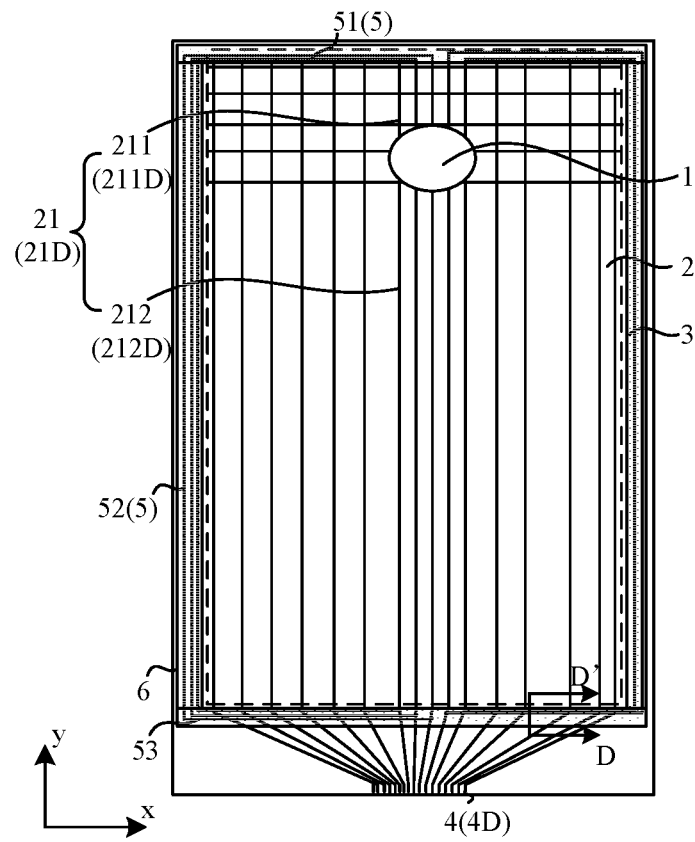
FIG. 7 is a schematic diagram of another display panel according to an embodiment of the present disclosure.

The at least one connection line 5 may further include a third connection line 53. FIG. 7 is a schematic diagram of still another display panel according to an embodiment of the present disclosure. As shown in FIG. 7, the second end of the second connection line 52 is connected to a first end of the third connection line 53, and a second end of the third connection line 53 is connected to the second data line 212D. In this way, the first data line 211D can be connected to the second data line 212D sequentially through the first connection line 51, the second connection line 52, and the third connection line 53. Then the first data line 211D and the second data line 212D can receive a data signal by the data line binding pin 4D connected to the second data line 212D, thereby reducing the number of data line binding pins 4D, and thus reducing the number of corresponding pins on the driving chip and reducing the cost of the driving chip.

As shown in FIG. 7, the first data line 211D and the second data line 212D electrically connected thereto are located in a same column, so that when the display panel performs displaying, one data line binding pin can be used to drive one column of pixels connected to the first data line 211D and the second data line 212D in a time division manner.

Figure 8:
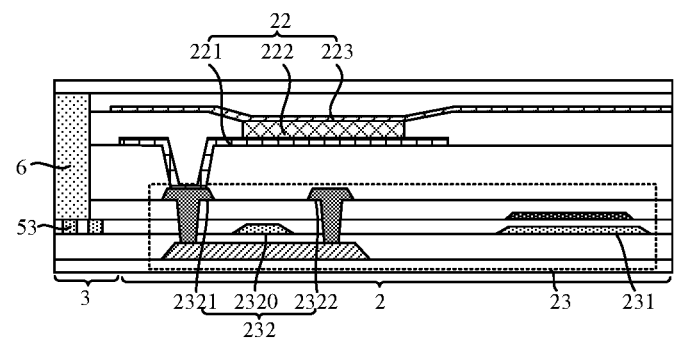
FIG. 8 is a cross-sectional view of FIG. 7 along DD' line.
Figure 9:
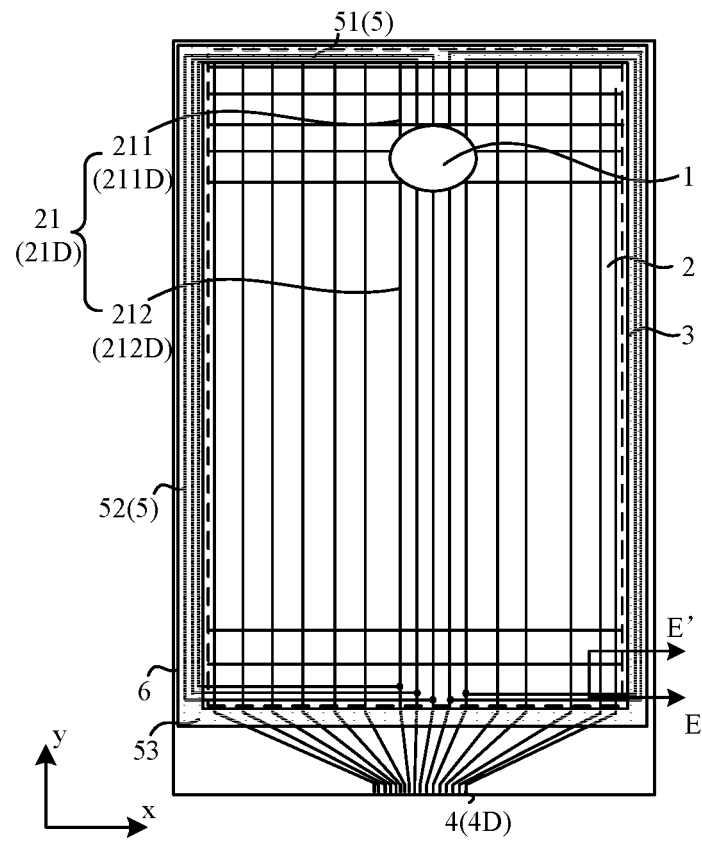
FIG. 9 is a schematic diagram of still another display panel according to an embodiment of the present disclosure.
Figure 10:
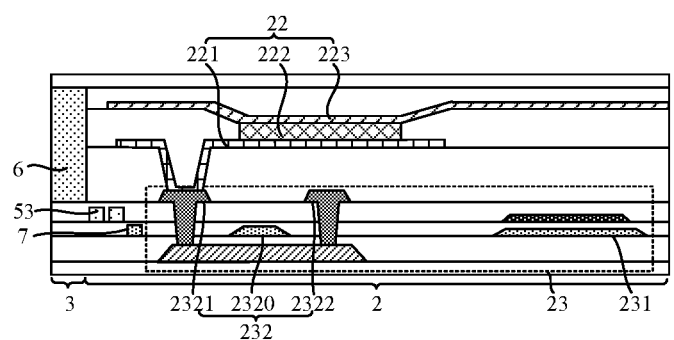
FIG. 10 is a cross-sectional view of FIG. 9 along EE' line.

In an example, similar to the manner of setting the first connection line 51, the third connection line 53 may also be disposed within the display region 2 or the non-display region 3. FIG. 8 is a schematic cross-sectional view along line DD' of FIG. 7. As shown in FIG. 7 and FIG. 8, the third connection line 53 is disposed within the non-display region 3, and the third connection line 53 may be arranged to overlap with the glass cement 6, so as to reduce the size of a part of the non-display region 3 in which the third connection line 53 is disposed. In one embodiment, as shown in FIG. 9 and FIG. 10, where FIG. 9 is a schematic diagram of yet still another display panel according to an embodiment of the present disclosure, and FIG. 10 is a schematic cross-sectional view along line EE' of FIG. 9, the third connection line 53 is disposed within the display region 2, and the third connection line 53 is disposed in a different layer from the scan line 7. On the basis of increasing space utilization of the display region 2, it can prevent the third connection line 53 from affecting the accuracy of the signal in the scan line 7. Similarly, in an embodiment shown in FIG. 9, the display region 2 is provided with a reference voltage signal line Vref, and various signal lines such as a power signal line PVDD (for the sake of simplicity of the illustration, the reference voltage signal line Vref and the power supply signal line PVDD are not shown in FIG. 9 and FIG. 10). In this embodiment, when the third connection line 53 is disposed within the display region 2, it merely requires that the third connection line 53 is not connected to other signal line in the display region 2 other than the second data line 212D and is disposed in a different layer from the scan line 7, and other limitation on the position of the third connection line 53 is not made herein.

Figure 11:
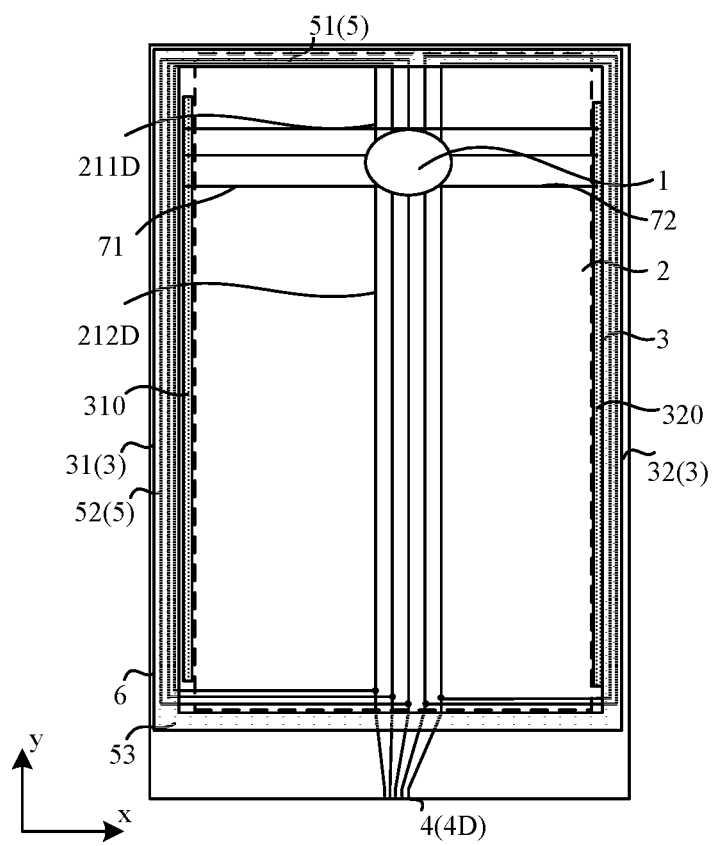
FIG. 11 is a schematic diagram of yet still another display panel according to an embodiment of the present disclosure.

In an example, as shown in FIG. 11, which is a schematic diagram of yet still another display panel according to an embodiment of the present disclosure, the non-display region 3 includes a first non-display region 31 and a second non-display region 32. The first non-display region 31, the transparent region 1 and the second non-display region 32 are sequentially arranged in the first direction x. The display panel includes a first scan line 71 and a second scan line 72 which are located at two sides of the transparent region 1. The first non-display region 31 is provided with a first gate driving device 310, and the first gate driving device 310 is connected to the first scan line 71. The second non-display region 32 is provided with a second gate driving device 320, and the second gate driving device 320 is connected to the second scan line 72. In this embodiment of the present disclosure, the first non-display region 31 and the second non-display region 32 are respectively provided with the first gate driving device 310 and the second gate driving device 320, and the first gate driving device 310 is connected to the first scan line 71 and the second gate driving device 320 is connected to the second scan line 72. That is, the first scan line 71 and the second scan line 72 respectively located at two sides of the transparent region 1 are driven in a bilateral driving manner, so that under a precondition of achieving normal display of the display region 2, it can avoid the situation that the scan line is disposed within the transparent region 1, thereby increasing light transmittance of the transparent region 1.

Figure 12:
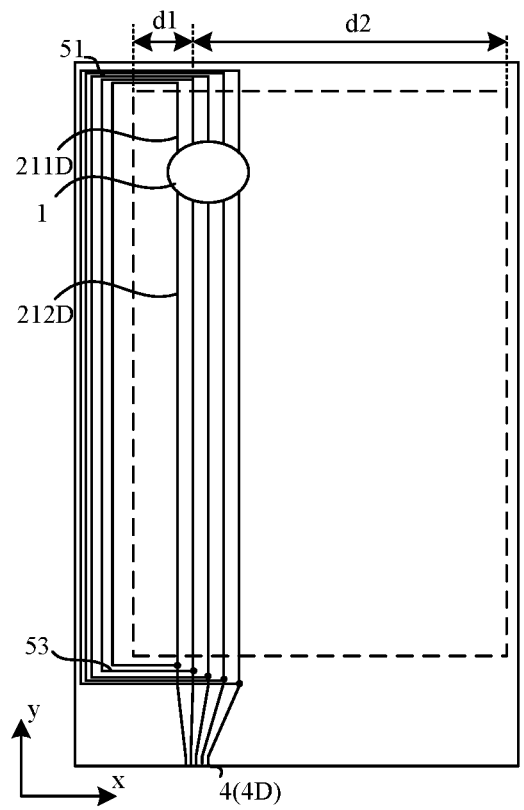
FIG. 12 is a schematic diagram of yet still another display panel according to an embodiment of the present disclosure.

In an embodiment, the position of the second connection line 52 can be arranged in various manners. FIG. 12 is a schematic diagram of yet still another display panel according to an embodiment of the present disclosure. As shown in FIG. 12, when a distance d1 between the data line 21D and the first non-display region 31 is smaller than a distance d2 between the data line 21D and the second non-display region 32, the second connection line 52 is disposed within the first non-display region 31. That is, when the data line 2D is close to the first non-display region 31, the second connection line 52 is disposed within the first non-display region 31. In this way, the first connection line 51 and/or the third connection line 53 can be set shorter, so that space occupied by the first connection line 51 and/or the third connection line 53 can be reduced, and it can avoid an increasing voltage drop in the trace caused by an excessive length of the first connection line 51 and/or the third connection line 53.

Similarly, when the distance between the data line 21D and the second non-display region 32 is smaller than the distance between the data line 21D and the first non-display region 31, the second connection line 52 is disposed within the second non-display region 32. That is, when the data line 21D is close to the second non-display region 32, the second connection line 52 can be disposed in the second non-display region 32. In this way, the first connection line 51 and/or the third connection line 53 can be set shorter.

In addition, in an embodiment, when N is an even number larger than or equal to 2, in the first direction x, the second connection line 52 corresponding to each of a $1^{st}$ line data line 21D to a $(N/2)^{th}$ data line 21D can be disposed within the first non-display region 31, and the second connection line 52 corresponding to each of a $(N/2+1)^{th}$ data line 2D to an $N^{th}$ data line 21D can be disposed within the second non-display region 32. In one embodiment, when N is an odd number larger than or equal to 2, in the first direction x, the second connection line 52 corresponding to each of a $1^{st}$ data line 21D to a $((N+1)/2)^{th}$ data line 21D can be disposed within the first non-display region 31, and the second connection line 52 corresponding to each of a $((N+3)/2)^{th}$ data line 21D to an $N^{th}$ data line 21D can be disposed within the second non-display region 32. That is, the second connection lines connected to data lines 21D are evenly distributed within the first non-display region 31 and the second non-display region 32 as much as possible, so that the size of the first non-display region 31 in the first direction x can be closer to the size of the second non-display region 32 in the first direction x as much as possible.

Figure 13:
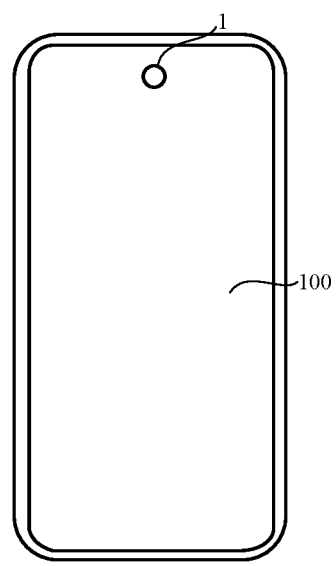
FIG. 13 is a schematic diagram of a display device according to an embodiment of the present disclosure.

An embodiment of the present disclosure further provides a display device. FIG. 13 is a schematic diagram of a display device according to an embodiment of the present disclosure. As shown in FIG. 13, the display device includes the abovementioned display panel 100 having a transparent region 1. The structure of the display panel 100 has been described in detail in the above embodiments, and the details are not further described herein. It should be noted that the display device as shown in FIG. 13 is merely illustrative, and the display device may be any electronic device having a display function, such as a cellphone, a tablet computer, a laptop computer, an electronic paper book, or a television.

In this embodiment of the present disclosure, the display panel of the display device is divided into a transparent region and a display region surrounding the transparent region, the display region is provided with at least one signal line and the transparent region is provided with no signal line. In this way, it can avoid an influence of the signal line on light transmittance of the transparent region, so that light-sensing devices such as a camera, a light sensor, and an iris sensor can be disposed within the transparent region to enrich the usage functions of the display panel.

Moreover, in this embodiment of the present disclosure, the at least one signal line disposed within the display region includes at least one first signal line and at least one second signal line, and at least one connection line connected to the first signal line is disposed within the non-display region, so that the signal line can keep away from the transparent region. In this way, under a precondition of increasing light transmittance of the transparent region, it can avoid that too many lines are disposed around the transparent region, so that more space in the display panel can be used for pixels, thereby improving the screen-to-body ratio of the display panel.

In addition, in this embodiment of the present disclosure, within the non-display region, at least a part of the connection line overlaps with the glass cement, such that the laser reaching the glass cement can be reflected to the glass cement by the connection line when the glass cement is melted to achieves encapsulation of the display panel, which can increase a usage rate of the laser and expedite melting of the glass cement. Moreover, in this embodiment, at least a part of the connection line overlaps with the glass cement, so that space occupied by the connection line and the glass cement can be reduced, so that the non-display region can be set smaller, thereby further improving the screen-to-body ratio of the display panel.

What is claimed is:

1. A display panel, wherein the display panel has a transparent region, a display region surrounding the transparent region, and a non-display region surrounding the display region, and the display panel comprises:

at least one binding pin;

at least one signal line disposed within the display region;

at least one connection line disposed within the non-display region; and glass cement disposed within the non-display region, wherein no signal line is disposed within the transparent region; the at least one signal line comprises a first signal line and a second signal line, and the first signal line and the at least one binding pin are respectively located at two sides of the transparent region; the first signal line is electrically connected to the at least one connection line; and at least a part of the at least one connection line overlaps with the glass cement, the at least one signal line comprises N data lines arranged in a first direction and extending in a second direction, and N is a positive integer; the at least one binding pin comprises a data line binding pin;

the N data lines comprise a first data line and a second data line, the first data line and the data line binding pin are respectively located at two sides of the transparent region, and the second data line is electrically connected to the data line binding pin, the at least one connection line comprises a first connection line extending along the first direction and a second connection line extending along the second direction;

a first end of the first data line is connected to a first end of the first connection line, and a first end of the second connection line is connected to a second end of the first connection line; and the second connection line is disposed within the non-display region and overlaps with the glass cement.

2. The display panel according to claim 1, wherein a second end of the second connection line is electrically connected to the data line binding pin.

3. The display panel according to claim 2, wherein the first connection line is disposed within the non-display region and overlaps with the glass cement.

4. The display panel according to claim 2, wherein the display panel further comprises at least one scan line disposed within the display region; the at least one scan line extends in the first direction and is arranged in the second direction;
   no scan line is disposed in the transparent region; and
   the first connection line is disposed within the display region and disposed in a different layer from the at least one scan line.

5. The display panel according to claim 2, wherein
   the non-display region comprises a first non-display region and a second non-display region; the first non-display region, the transparent region, and the second non-display region are sequentially arranged along the first direction;
   the display panel further comprises a first scan line and a second scan line, and the first scan line and the second scan line are located at two sides of the transparent region;
   the first non-display region is provided with a first gate driving device, and the first gate driving device is connected to the first scan line; and
   the second non-display region is provided with a second gate driving device, and the second gate driving device is connected to the second scan line.

6. The display panel according to claim 1, wherein the at least one connection line further comprises a third connection line, and a second end of the second connection line is connected to a first end of the third connection line, and a second end of the third connection line is connected to the second data line.

7. The display panel according to claim 6, wherein the first data line and the second data line electrically connected to the first data line are located in a same column.

8. The display panel according to claim 6, wherein the third connection line is disposed within the non-display region and overlaps with the glass cement.

9. The display panel according to claim 6, wherein the display panel further comprises at least one scan line disposed within the display region; the at least one scan line extends in the first direction and is arranged in the second direction;
   no scan line is disposed in the transparent region; and
   the third connection line is disposed within the display region and disposed in a different layer from the at least one scan line.

10. The display panel according to claim 6, wherein
    the non-display region comprises a first non-display region and a second non-display region; the first non-display region, the transparent region, and the second non-display region are sequentially arranged along the first direction;
    the display panel further comprises a first scan line and a second scan line, and the first scan line and the second scan line are located at two sides of the transparent region;
    the first non-display region is provided with a first gate driving device, and the first gate driving device is connected to the first scan line; and
    the second non-display region is provided with a second gate driving device, and the second gate driving device is connected to the second scan line.

11. The display panel according to claim 10, wherein
    when a distance between the N data lines and the first non-display region is smaller than a distance between the N data lines and the second non-display region, the second connection line is disposed within the first non-display region; and
    when a distance between the N data lines and the second non-display region is smaller than a distance between the N data lines and the first non-display region, the second connection line is disposed within the second non-display region.

12. The display panel according to claim 10, wherein
    when N is an even number larger than or equal to 2, in the first direction x, the second connection line corresponding to each of a $1^{st}$ data line to a $(N/2)^{th}$ data line is disposed within the first non-display region, and the second connection line corresponding to each of a $(N/2+1)^{th}$ data line to an $N^{th}$ data line is disposed within the second non-display region; and
    when N is an odd number larger than or equal to 2, in the first direction x, the second connection line corresponding to each of a $1^{st}$ data line to a $((N+1)/2)^{th}$ data line is disposed within the first non-display region, and the second connection line corresponding to each of a $((N+3)/2)^{th}$ data line to an $N^{th}$ data line is disposed within the second non-display region.

13. A display device, comprising:
    a display panel, wherein the display panel has a transparent region, a display region surrounding the transparent region, and a non-display region surrounding the display region, and the display panel comprises:
    at least one binding pin;
    at least one signal line disposed within the display region;
    at least one connection line disposed within the non-display region; and
    glass cement disposed within the non-display region,
    wherein no signal line is disposed within the transparent region; the at least one signal line comprises a first signal line and a second signal line, and the first signal line and the at least one binding pin are respectively located at two sides of the transparent region; the first signal line is electrically connected to the at least one connection line; and at least a part of the at least one connection line overlaps with the glass cement,
    the at least one signal line comprises N data lines arranged in a first direction and extending in a second direction, and N is a positive integer; the at least one binding pin comprises a data line binding pin;
    the N data lines comprise a first data line and a second data line, the first data line and the data line binding pin are respectively located at two sides of the transparent region, and the second data line is electrically connected to the data line binding pin,
    the at least one connection line comprises a first connection line extending along the first direction and a second connection line extending along the second direction;
    a first end of the first data line is connected to a first end of the first connection line, and a first end of the second connection line is connected to a second end of the first connection line; and
    the second connection line is disposed within the non-display region and overlaps with the glass cement.

14. The display panel according to claim 1, further comprising a pixel driving circuit disposed in the display region,
   wherein the pixel driving circuit comprises a storage capacitor and a plurality of thin film transistors, each of the plurality of thin film transistors comprising a source, a drain, and a gate, and
   wherein the first connection line is disposed in a same layer as the gate of each of the plurality of thin film transistors.

15. The display panel according to claim 1, wherein the second connection line is disposed in a layer different from that of the N data lines.

* * * * *